United States Patent [19]

Laine

[11] Patent Number: 5,254,839
[45] Date of Patent: Oct. 19, 1993

[54] OVEN FOR BURNING IN ELECTRONICS MODULES

[75] Inventor: Bernard Laine, Nogent-sur-Marne, France

[73] Assignee: Froilabo, Ozoir la Ferrier, France

[21] Appl. No.: 731,255

[22] Filed: Jul. 17, 1991

[30] Foreign Application Priority Data

Jul. 23, 1990 [FR] France .................. 90 09389

[51] Int. Cl.⁵ .............................................. H05B 1/02
[52] U.S. Cl. ..................................... 219/494; 219/483; 219/486; 219/508; 219/209; 324/158 F
[58] Field of Search ................ 219/494, 497, 483–486, 219/501, 506, 508, 210, 385, 209; 324/158 F

[56] References Cited

U.S. PATENT DOCUMENTS

| | | | |
|---|---|---|---|
| 4,101,759 | 7/1978 | Anthony et al. | 219/486 |
| 4,657,572 | 4/1987 | Desai et al. | 219/486 |
| 4,777,434 | 10/1988 | Miller et al. | 219/209 |
| 4,852,516 | 8/1989 | Rubin et al. | 219/385 |
| 4,881,591 | 11/1989 | Rignall | 219/494 |
| 5,003,156 | 3/1991 | Kilpatrick et al. | 219/209 |
| 5,126,533 | 6/1992 | Newman et al. | 219/385 |
| 5,164,661 | 11/1992 | Jones | 219/209 |

FOREIGN PATENT DOCUMENTS 0314481 10/1988 European Pat. Off. .

OTHER PUBLICATIONS

IBM Technical Disclosure Bulletin, vol. 9, No. 3, Aug. 1966, p. 342.

*Primary Examiner*—Mark H. Paschall
*Attorney, Agent, or Firm*—Wegner, Cantor, Mueller & Player

[57] ABSTRACT

A stove for burning in electronic modules which incorporate a heatsink to radiate heat comprises for each module controlled electrical power supply circuits and locally controlled temperature regulators employing a controllable dissipator comprising a heat shunt. The heat shunt comprises a heat conducting body, an arrangement for placing the heat conducting body in contact with the heatsink of the module so that they cooperate thermally as a result of the resulting conduction of heat by contact, an arrangement for heating the heat conducting body and a heatsink adapted to dissipate heat from the heat conducting body to an external environment. The dimensions and the geometry of the heatsink of the shunt and the temperature and ventilation conditions of the external environment are adapted to enable a quantity of heat to be extracted from the shunt by its heatsink which is greater than the quantity of heat dissipated by the heatsink of the module. A device is provided for measuring the temperature of the module. A control system for the heating device is adapted to operate in response to a signal delivered by the temperature measuring system so as to apply to the shunt a quantity of heat enabling heat to be input to the module or removed therefrom. The oven further comprises, for all modules, a centralized control unit supervising through a network the operation of the various modules and their associated locally controlled temperature regulators.

6 Claims, 2 Drawing Sheets

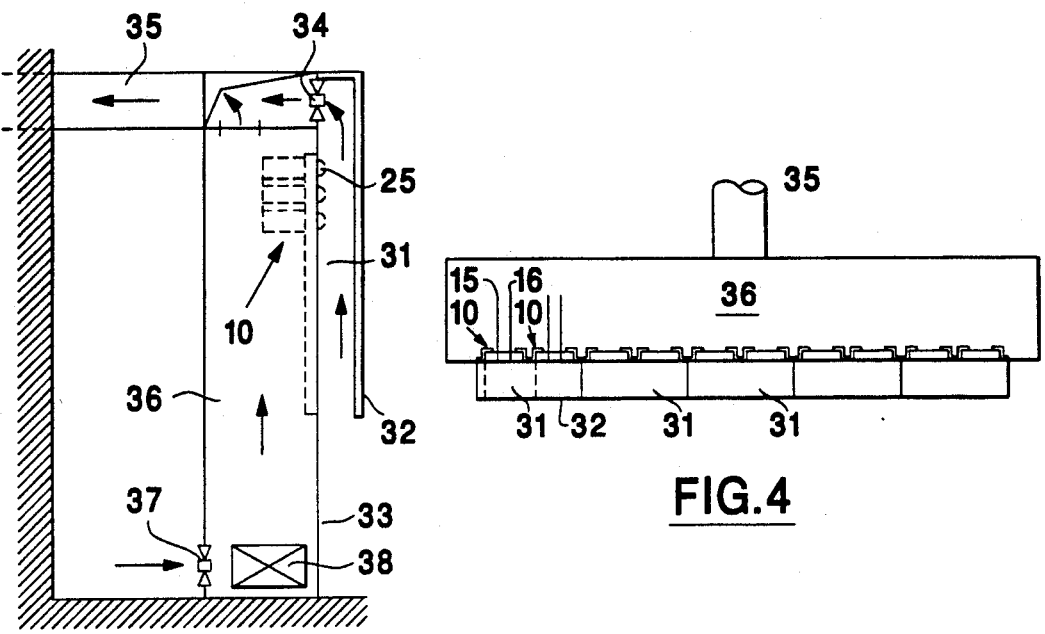
FIG.3
FIG.4
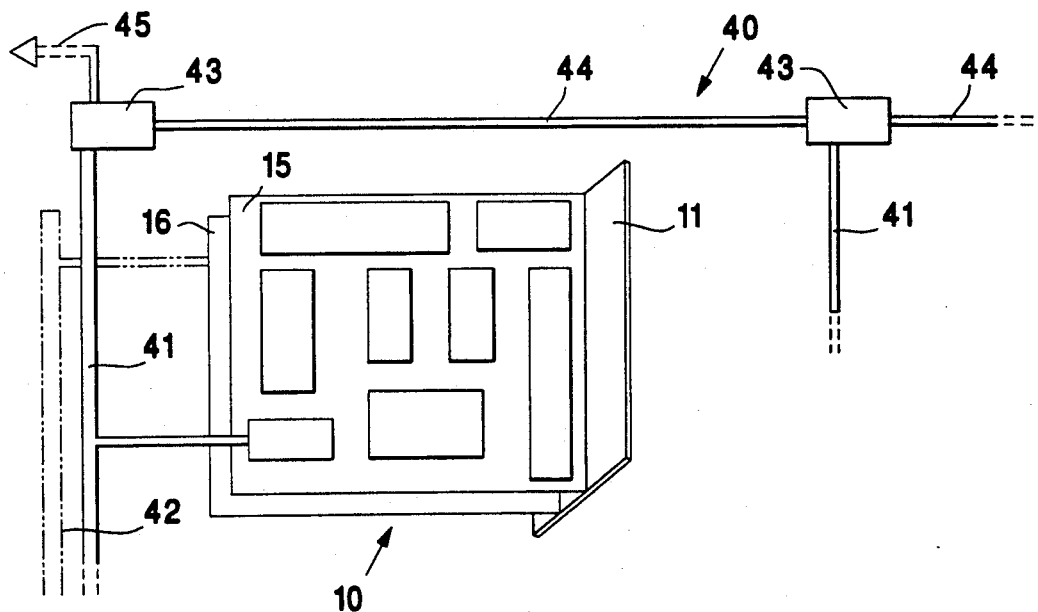
FIG.5

OVEN FOR BURNING IN ELECTRONICS MODULES

BACKGROUND OF THE INVENTION

1. FIELD OF THE INVENTION

The present invention concerns an oven for burning in electronics modules, in other words for operating a batch of electronics modules for a sufficient time to eliminate those subject to premature failure.

2. DESCRIPTION OF THE PRIOR ART

Burning in is carried out at raised temperature so that the modules operate under extreme junction temperature conditions, either at constant temperature or according to predetermined thermal cycles.

Until now this operation has been carried out by placing the modules in a ventilated oven the temperature in which is regulated in the conventional way by a thermostat device.

This prior art method has the disadvantage of a highly non-uniform distribution of temperature where the modules dissipate a significant amount of heat (more than 10 W). The various modules in the oven are therefore subject to varying thermal stresses, excessive in some cases and insufficient in others.

This drawback is accentuated in the case of dynamic burning in whereby the module is operated for a first period at moderate dissipation and then for a second period at maximum dissipation. Given that not all the modules are placed in the oven at the same time, and therefore do not begin the burning in cycle simultaneously, there are simultaneously in the oven modules in the low dissipation mode and others in the high dissipation mode, which further accentuates temperature differentials within the oven, contrary to its primary function.

One object of the invention is to propose an oven for burning in large batches of modules (several dozen or several hundred at a time) with all modules undergoing uniform thermal stresses.

Another object of the invention is to propose a burning in oven enabling the temperature to be regulated individually at each module so that all modules are burned in under exactly the same conditions.

The basic principle of the invention is to apply to the cooling heatsink of each module a heat shunt having a male comb shape matching the shape of the module heatsink, the external surface of the heat shunt being provided with a heatsink whose design dissipation capacity is greater than that of any module to be tested.

The temperature of each module can be regulated locally and is not dependent on the uniformity of the temperature within the oven.

As regulation will always be required (whether heat is supplied to or removed from the module), the controlled heating element will compensate for the greater or lesser quantity of heat that the heatsink of the block would dissipate given the local temperature of its environment, that is to say the local temperature within the oven.

SUMMARY OF THE INVENTION

The present invention consists in an oven for burning in electronics modules which incorporate a heatsink to radiate heat, said oven comprising for each module controlled electrical power supply circuits and locally controlled temperature regulator means employing a controllable dissipator comprising:

a heat shunt comprising:
  a heat conducting body,
  means for placing said heat conducting body in thermal contact with said heatsink of said module so that they cooperate thermally as a result of the resulting conduction of heat by contact,
  means for heating said heat conducting body, and
  a heatsink adapted to dissipate heat from said heat conducting body to an external environment,
  the dimensions and the geometry of said heatsink of said shunt and the temperature and ventilation conditions of said external environment being adapted to enable a quantity of heat to be extracted from said shunt by said heatsink of said shunt which is greater than the quantity of heat dissipated by said heatsink of said module,
means for measuring the temperature of the module, and
control means for said heating means adapted to operate in response to a signal delivered by said temperature measuring means so as to heat said shunt to apply to it a quantity of heat enabling heat to be input to the module or removed therefrom so as to regulate the temperature of the module to a given set point value greater than or less than the temperature of the module were it not in contact with said heat shunt,
the oven further comprising, for all modules, a centralized control unit supervising through a network the operation of the various modules and their associated locally controlled temperature regulator means.

Each controllable dissipator is advantageously in the form of a printed circuit board comprising on one side the heat shunt receiving the module and on its other side the power supply, regulator and test circuits which include said module temperature measuring circuit, said heating means control circuit and controlled electrical power supply and test circuits for the module.

A network architecture can then be used, with at least one multiplexer connected to a plurality of said power supply, regulator and test electronic circuits, each multiplexer managing in this way a plurality of modules and being itself connected to a centralized control unit receiving data from each module or sending data thereto via the multiplexer associated with the module.

Said means for placing the heat conducting body in thermal contact with the heatsink of the module advantageously comprise a comb member with a shape homologous to that of the fins of the heatsink of the module and adapted to be nested within the latter, means being provided to urge elastically the comb member against the fins of the heatsink of the module so as to press these two members into contact.

Said means for heating the heat conducting body preferably comprise a planar thin-film resistor deposited onto the surface of the body.

Other features and advantages of the invention will emerge from the following detailed description given with reference to the appended drawings in which the same reference numbers designate identical items.

BRIEF DESCRIPTION OF THE DRAWINGS

FIG. 1 is a plan view of one compartment of an oven receiving a module to be burned in.

FIG. 3 is a view in elevation and in cross-section on the line III—III in FIG. 2 of an oven showing the circulation of air within it.

FIG. 4 is a plan view of the oven in cross-section on the line IV—IV in FIG. 2.

FIG. 5 shows how the various electronic circuit boards of the oven are interconnected to form a network.

DETAILED DESCRIPTION OF THE INVENTION

Figure 1:
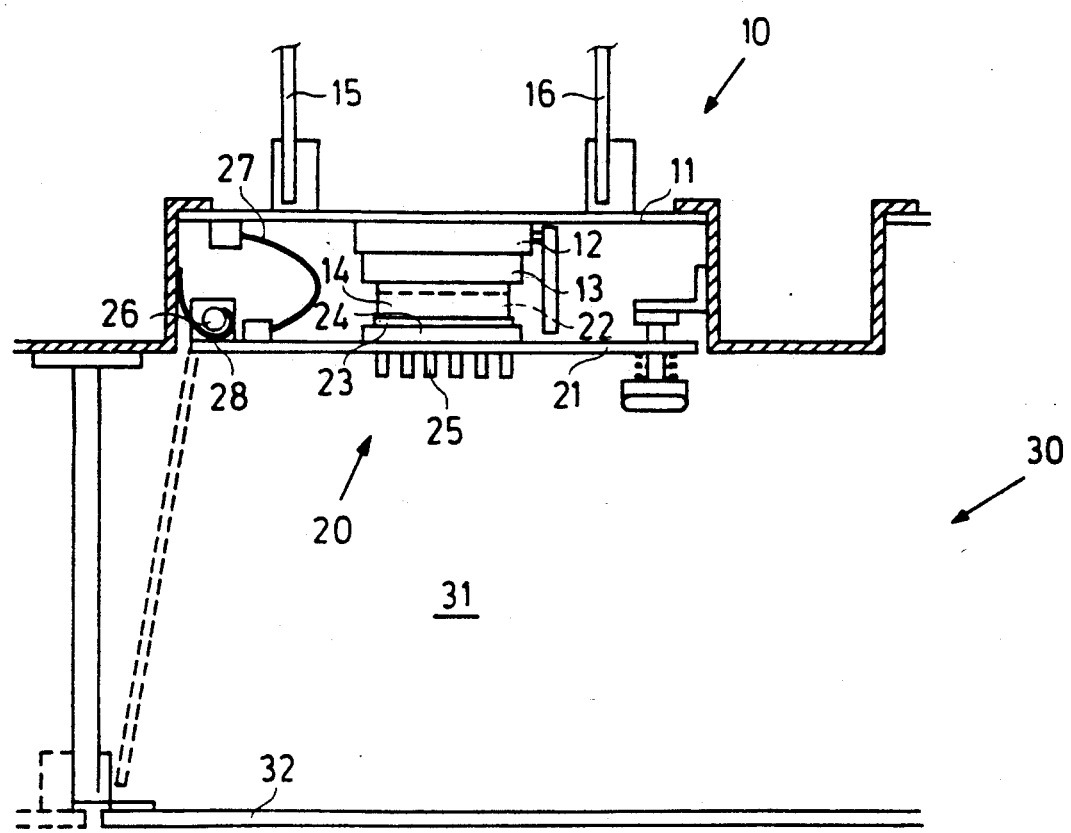

Referring to FIG. 1, the oven comprises a plurality of housings formed within the structure of the oven and each equipped with a subsystem 10 adapted to receive one module to be burned in and comprising a printed circuit board 11 carrying a module socket 12, preferably a zero insertion force socket, into which the module under test 13 is plugged; the module under test includes a heatsink 14 to dissipate heat.

The subsystem 10 further comprises a control circuit board 15 providing a data transmission network interface and temperature regulator function and a power supply board 16 producing and distributing the various voltages needed for the module to operate. A subsystem 10 is provided for each module under test.

The temperature regulator function is implemented by a heat shunt 20 mounted on a mobile support 21 comprising a light alloy comb member 22 matching the shape of the fins of the heatsink 14 of the module 13, a resistor 23 and a heatsink 24 provided with external heat dissipating fins 25 and made from a material that is a good conductor of heat such as aluminum or copper.

The thermal resistance between the comb member 22 in contact with the heatsink of the module and the heatsink 24 must be as low as possible and for this reason the resistor 23 interleaved between these two members is a very thin resistor, typically a resistor deposited onto a thermoplastic polyester film and supplied with electrical power at a low voltage.

The support plate 21 is articulated at 26 to the framework of the oven to enable access to the module for its insertion and removal. Elastic means such as a leaf spring 27 are provided so that the heat shunt 20 is pressed lightly onto the module to ensure good transfer of heat between these two members. The support plate 21 is held open by a return spring 28 accommodated in the hinge 26 so that it does not impede the insertion and extraction of the module.

Figure 2:
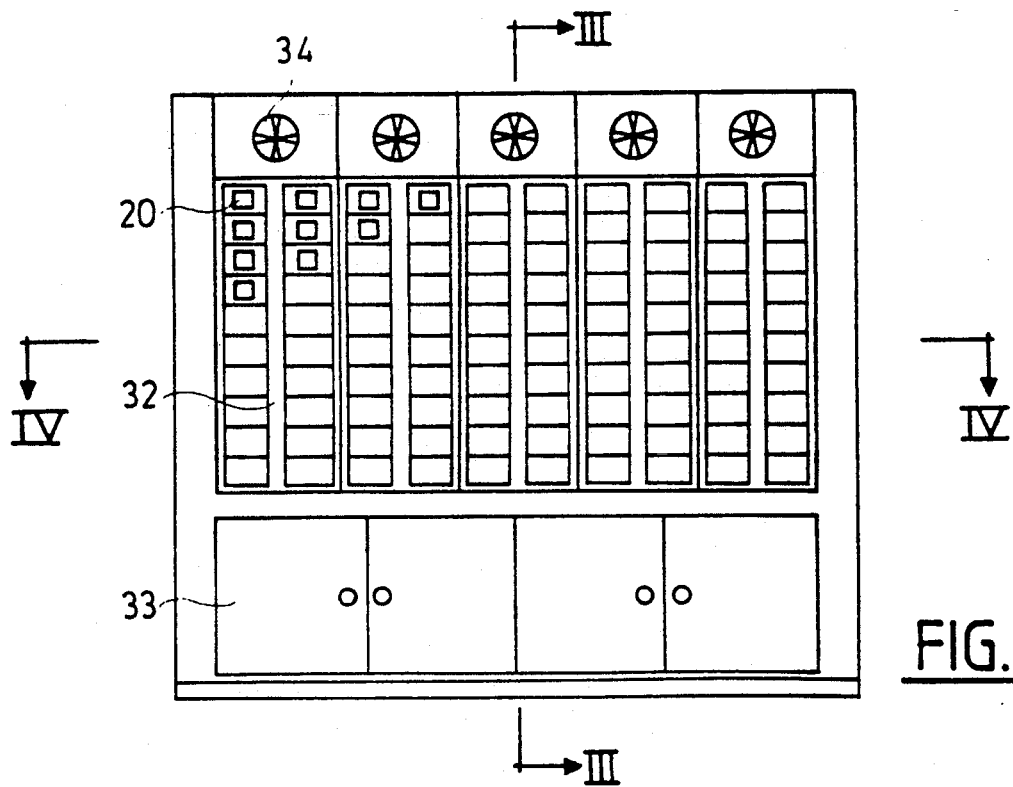
FIG. 2 is a general front view of an oven in accordance with the invention for collectively burning in a batch of 100 modules.

Referring to FIGS. 2 through 4, there are provided as many housings and subsystems such as that shown in FIG. 1 as there are modules under test, all being assembled together into a cabinet receiving 100 modules divided between ten rows each of ten modules, for example.

The heatsink fins 25 of the temperature regulator units of the various subsystems are all disposed in a closed ventilated enclosure 31 (FIGS. 1, 3 and 4).

Transparent doors 32 disposed in front of the temperature regulator blocks channel vertically a forced flow of air which evacuates the heat dissipated by the heat shunts and the modules. Cool air is drawn in at the bottom (33) by a series of fans 34 disposed at the top of the cabinet and discharging aspirated ambient air, heated in the enclosure 31 by virtue of contact with the heatsinks 25 of the various temperature regulator blocks, into a horizontal exhaust duct 35 connected to trunking leading to the exterior of the premises.

Additional ventilation may be provided in the region 36 to the rear of the various temperature regulator blocks, by means of a fan 37 in the lower part of the oven, which also cools the main power supply units 38.

The module temperature is regulated as follows:

If the heat being dissipated by the module is not sufficient to raise its junction temperature to the burnin temperature (typically 165° C.), additional heat input is provided by the resistor 23.

On the other hand, if the heat dissipation of the module is such that it requires to be cooled, the resistor 23 is used as a controllable dissipator, the heatsink of the heat shunt being capable of extracting a greater quantity of heat than the heatsink of the module could on its own; in other words, the fins 25 of the heatsink 24 of the heat shunt provide a heat pumping capacity greater than the requirements of the module and the difference is provided by the resistor 23, which is always energized and therefore provides local temperature regulation specific to the module concerned, irrespective of the ambient air temperature.

The temperature of each module is measured by two thermocouples, one associated with the control circuit board 15 of the subsystem to regulate the temperature of the module and the other connected to an independent circuit as a thermal safety device. This circuit linearizes the signal and compares its value with a manually set alarm level, responding if necessary by cutting off the heat input and the power supply by operating a relay. This measuring and safety system is totally independent of the temperature regulator circuits on the control circuit board 15.

With a configuration of this kind it has been possible to obtain for each module a junction temperature regulated to 250° C. maximum.

Various modifications may be made to the embodiment described, for example by adding the facility to "generate cold" using Peltier devices if it is necessary to operate at relatively low temperatures, typically temperatures below 40° to 50° C., for example.

It is also possible to circulate cooled air rather than air at ambient temperature in the region 31, to improve the extraction of heat.

Furthermore, the control and power supply circuit boards 15 and 16 of the various subsystems can with great advantage be connected to form a network, as shown in FIG. 5.

A network architecture of this kind simplifies the electrical wiring, facilitates maintenance, renders each subsystem autonomous and improves overall reliability, as a general breakdown is practically impossible.

For example, with four ovens each containing 100 modules, the network comprises 400 subsystems 10 (one per module) each comprising a control circuit board 15, a power supply circuit board 16 and a module support circuit board 11.

The various control circuit boards 15, for example the boards for ten adjoining subsystems, are connected by a common bus 41 and the power supply circuit boards 16 are connected to a common line 42.

Each bus 41 is connected to a network transceiver 43 which multiplexes data from the subsystems connected to it. There are 40 transceivers 43, interconnected by buses 44.

Finally, a microcomputer is connected to the network at 45 to supervise the operation of the 400 subsystems 10, all of which are autonomous.

It is therefore possible, on demand or automatically:

to display on the screen the value of the analog parameters of each module (voltage, current, etc), to modify the set point temperature individually for each module, to modify the order in which the supply voltages are increased or reduced, to log malfunctions and to take appropriate corrective action (for example, to cut off the power supply in response to a short-circuit on a module, voltage instability, temperature problems, etc), and to print out systematically or on demand any required information.

There is claimed:

1. An oven for burning in electronics modules, each of which incorporates a heatsink to radiate heat, said oven comprising for each module controlled electrical power supply circuits and locally controlled temperature regulator means employing a controllable dissipator comprising:

a heat shunt comprising:
a heat conducting body,
means for placing said heat conducting body in thermal contact with said heatsink of said module for conduction of heat therebetween,
means for heating said heat conducting body, and
a heatsink means for dissipating heat from said heat conducting body to an external environment,
dimensions and geometry of said heatsink means and temperature and ventilation conditions of said external environment being sufficient to enable a quantity of heat to be extracted from said shunt by said heatsink means which is greater than a quantity of heat dissipated by said heatsink of said module,
means for measuring module temperature, and
means for controlling said heating means in response to a signal delivered by said module temperature measuring means, so as to control heating of said shunt and, in turn, inputting of heat to and removing of heat from said module via said heat shunt so as to regulate temperature of each of said modules to a given set point value, the oven further comprising, for all modules, a centralized control unit supervising, through a network, operation of said modules and their associated locally controlled temperature regulator means.

2. Oven according to claim 1 wherein each controllable dissipator is in the form of a circuit board carrying on one side the heat shunt receiving the module and on its other side power supply, temperature regulator and test circuits having a circuit for said module temperature measuring means, a circuit for said means for controlling said heating means, said controlled electrical power supply and module test circuits.

3. Oven according to claim 2 comprising at least one multiplexer connected to a plurality of said power supply, temperature regulator and test circuits, each said multiplexer managing a plurality of said modules and being itself connected to said centralized control unit, said centralized control unit receiving data from each said module or sending data thereto via the multiplexer associated with the module.

4. Oven according to claim 1 wherein said means for placing said heat conducting body in thermal contact with said heatsink of said module comprise a comb member having a shape which is homologous to that of fins of said heatsink of the module and adapted to be nested therein.

5. Oven according to claim 4 wherein said means for placing said heat conducting body in thermal contact with said heatsink of said module further comprise means for urging said comb member eleastically against said fins of said heatsink of the module so as to press said comb member and said fins into contact with each other.

6. Oven according to claim 1 wherein said means for heating said heat conducting body of said shunt comprise a planar thin-film resistor deposited onto a surface of said heat conducting body.

* * * * *